United States Patent
Harris

(10) Patent No.: US 10,477,321 B2
(45) Date of Patent: Nov. 12, 2019

(54) DRIVING DISTRIBUTED MODE LOUDSPEAKER ACTUATOR THAT INCLUDES PATTERNED ELECTRODES

(71) Applicant: NVF Tech Ltd., St. Neots, Cambridgeshire (GB)

(72) Inventor: Neil John Harris, Whittlesford (GB)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 15/912,436

(22) Filed: Mar. 5, 2018

(65) Prior Publication Data

US 2019/0273992 A1   Sep. 5, 2019

(51) Int. Cl.
| | |
|---|---|
| *H04R 17/10* | (2006.01) |
| *B06B 1/06* | (2006.01) |
| *H04R 3/12* | (2006.01) |
| *H04M 1/03* | (2006.01) |

(52) U.S. Cl.
CPC .......... H04R 17/10 (2013.01); B06B 1/0662 (2013.01); H04R 3/12 (2013.01); H04M 1/03 (2013.01)

(58) Field of Classification Search
CPC ........ H04R 17/10; H04R 3/12; B06B 1/0662; H04M 1/03
See application file for complete search history.

(56) References Cited

U.S. PATENT DOCUMENTS

| | | | |
|---|---|---|---|
| 2,836,737 A | 5/1958 | Crownover | |
| 3,816,774 A | 6/1974 | Miyajima | |
| 6,137,890 A | 10/2000 | Markow | |
| 6,324,052 B1 | 11/2001 | Azima et al. | |
| 6,324,294 B1 | 11/2001 | Azima et al. | |
| 6,584,206 B2 | 6/2003 | Ohashi | |
| 7,149,318 B2 | 12/2006 | Bank et al. | |
| 7,475,598 B2 | 1/2009 | Starnes et al. | |

(Continued)

FOREIGN PATENT DOCUMENTS

| | | |
|---|---|---|
| JP | S5989800 | 10/1984 |
| JP | 2003345381 | 12/2003 |

(Continued)

OTHER PUBLICATIONS

PCT International Search Report Appln No. PCT/GB2018/053617, dated Feb. 19, 2019, 18 pages.

(Continued)

*Primary Examiner* — Joshua Kaufman
(74) *Attorney, Agent, or Firm* — Fish & Richardson P.C.

(57) ABSTRACT

A method includes determining, for a piezoelectric cantilever-type transducer of a distributed mode loudspeaker adapted to cause vibration of a load, a subset of frequencies from a range of frequencies at which to output vibrations, in which the transducer includes two or more electrode pairs positioned along a length of the transducer and each electrode pair including a first electrode on a first side of a piezoelectric layer of the transducer and a second electrode on a second side of the piezoelectric layer of the transducer that is opposite to the first side; selecting, for the subset of frequencies, a respective input voltage for each of the two or more electrode pairs based on a relative position of each pair on the transducer; and applying the respective input voltage to each of the two or more electrode pairs to cause the transducer to generate a vibrational force.

15 Claims, 11 Drawing Sheets

Device Side View

(56) References Cited

U.S. PATENT DOCUMENTS

| | | | |
|---|---|---|---|
| 7,684,576 | B2 | 3/2010 | Bank et al. |
| 9,041,662 | B2 | 5/2015 | Harris |
| 2002/0015507 | A1* | 2/2002 | Harris .................. H04R 7/045 381/431 |
| 2004/0061543 | A1* | 4/2004 | Nam .................. B81C 1/00182 327/342 |
| 2005/0007342 | A1 | 1/2005 | Cruz-Hernandez |
| 2010/0086151 | A1 | 4/2010 | Ruiter |
| 2015/0243874 | A1 | 8/2015 | East et al. |

FOREIGN PATENT DOCUMENTS

| | | |
|---|---|---|
| WO | WO 01/93628 | 12/2001 |
| WO | WO 2015/027571 | 3/2005 |
| WO | WO 2006/003367 | 1/2006 |

OTHER PUBLICATIONS

'Wikipedia.org' [online] "Distributed mode loudspeaker," Last Updated: Sep. 11, 2017, [retrieved on Oct. 31, 2017] Retrieved from Internet: URL<https://en.wikipedia.org/wiki/Distributed_mode_loudspeaker> 3 pages.

'simeoncanada.com' [online] "Nxttechnology review.01," Available on or before Mar. 4, 2017, [retrieved on Dec. 13, 2017] Retrieved from Internet: URL<https://simeoncanada.com/wp-content/uploads/RandI3.pdf> 32 pages.

Belvins. "Formulas for natural frequency and mode shape: Table 8-1. Single Span Beams," Formulas for natural frequency and mode shape, Reprint Edition 2001, Originally published New York: Van Nostrand, 1979, 2 pages.

PCT International Search Report Appln and Written Opinion in International Appln. No. PCT/GB2019/050581, dated May 17, 2019, 14 pages.

* cited by examiner

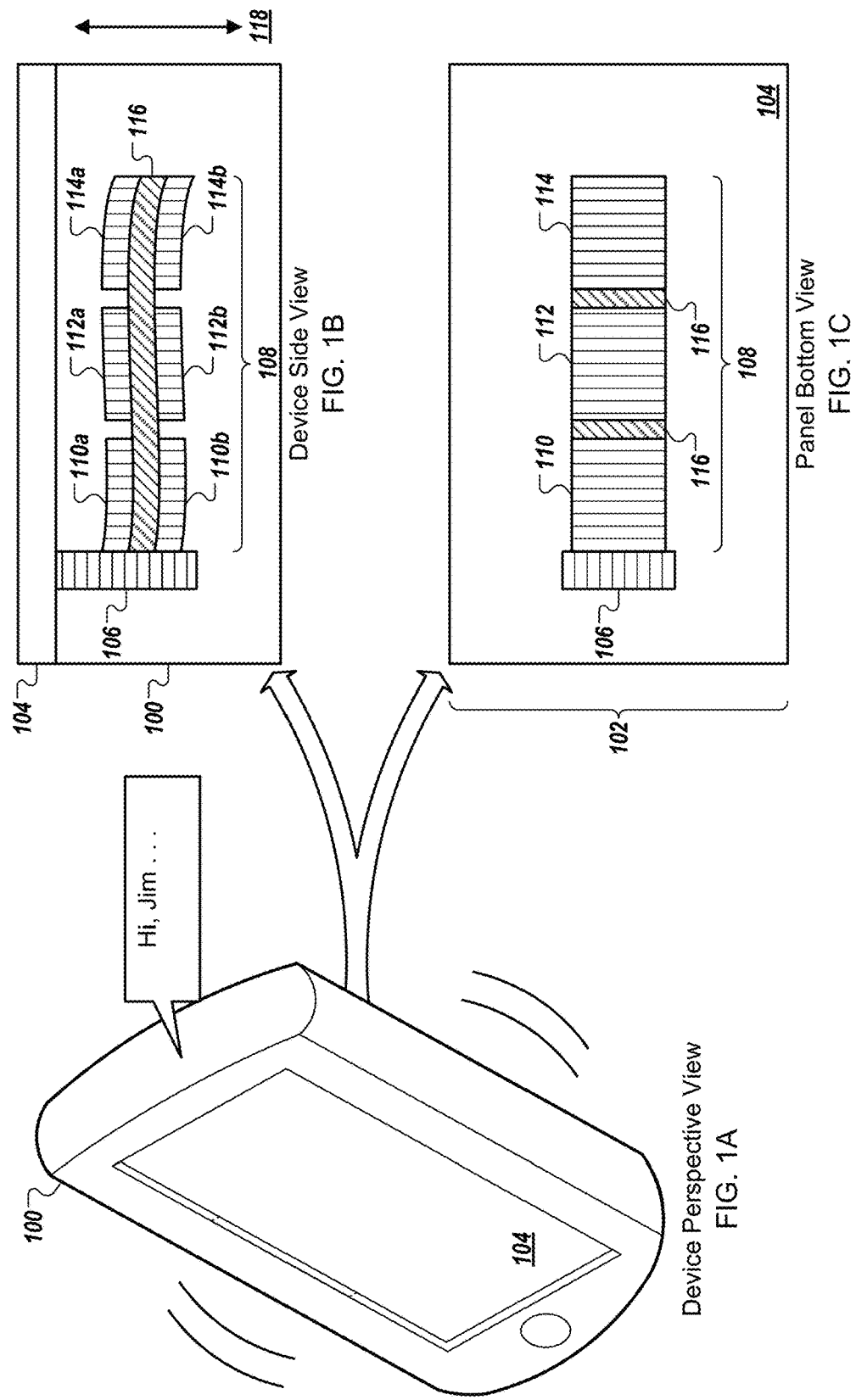

— Electrode 1
--- Electrode 2
—··— Electrode 3

DRIVING DISTRIBUTED MODE LOUDSPEAKER ACTUATOR THAT INCLUDES PATTERNED ELECTRODES

BACKGROUND

Some devices use a distributed mode loudspeaker ("DML") to generate sound. A DML is a speaker that creates sound by causing a panel to vibrate. A DML may use a distributed mode actuator ("DMA"), e.g., a piezoelectric transducer, to cause the panel to vibrate and generate sound instead of a voice coil actuator. For instance, a smartphone may include a DMA that applies force to a display panel (e.g., a LCD or an OLED panel) in the smartphone. The force creates vibrations of the display panel that couple to surrounding air to generate sound waves, e.g., in the range of 20 Hz to 20 kHz which may be audible to a human ear.

SUMMARY

A piezoelectric transducer in a distributed mode loudspeaker may include multiple electrode pairs used to generate sounds at different frequencies. For instance, the piezoelectric transducer may include a layer of a piezoelectric material, e.g., a piezoelectric ceramic material that extends between each electrode pair. For example, the layer may have a first electrode from an electrode pair on top of the layer and a second electrode from the electrode pair below the layer.

The distributed mode loudspeaker includes a drive module that selectively energizes one or more of the multiple electrode pairs to generate a sound at a particular subset of frequencies within the range of frequencies at which the distributed mode loudspeaker can generate sounds. The drive module may provide current and/or apply an oscillating voltage to one or more selected electrode pairs to cause a load, e.g., a display panel, connected to the distributed mode actuator, to generate the sound at the particular subset of frequencies.

Generally, the frequency response of the transducer and distributed mode loudspeaker will vary depending on the drive voltage applied to each electrode pair. Moreover, the response will typically vary depending on other factors too, such as the number of electrode pairs, the electrode geometries, and the spacing between electrode pairs. Accordingly, in order to optimize the response, different drive voltages can be selected for each electrode pair based on the acoustic output frequency of the distributed mode loudspeaker and the position of the electrode pair on the layer of a piezoelectric material. Different numbers and geometries of electrode pairs can also be selected in the design phase.

In general, in a first aspect a method includes determining, for a piezoelectric cantilever-type transducer of a distributed mode loudspeaker adapted to cause vibration of a load within a range of frequencies, a subset of frequencies from the range of frequencies at which to output vibrations, in which the transducer includes two or more electrode pairs positioned along a length of the transducer and each electrode pair includes a first electrode on a first side of a piezoelectric layer of the transducer and a second electrode on a second side of the piezoelectric layer of the transducer that is opposite to the first side; selecting, for the subset of frequencies, a respective input voltage for each of the two or more electrode pairs based on a relative position of each pair on the transducer, in which respective input voltages for at least two of the two or more electrode pairs are different; and applying the respective input voltage to each of the two or more electrode pairs to cause the transducer to generate a vibrational force on the load within the range of output frequencies, in which, in order to generate the vibrational force on the load within the range of output frequencies, the transducer undergoes vibrations which displace the piezoelectric layer by varying amounts along the length of the transducer, and the respective input voltages are selected to reduce an activation of a piezoelectric response at a location on the transducer corresponding to an electrode pair where the activation is out of phase with a displacement of the piezoelectric layer.

Implementations of the method can include one or more of the following features. Each input voltage can include a corresponding amplitude and a corresponding phase. The respective input voltages can be selected to reduce a current drawn by the transducer for the vibrational force.

The subset of frequencies can include 0 kHz to 10 kHz or 4 kHz to 10 kHz.

The transducer can have 2 or 3 electrode pairs.

In general, in a further aspect, a system includes a piezoelectric cantilever-type transducer of a distributed mode loudspeaker adapted to cause vibration of a load within a range of frequencies, the transducer includes a piezoelectric layer and two or more electrode pairs positioned along a length of the transducer, each electrode pair includes a first electrode on a first side of the piezoelectric layer and a second electrode on a second side of the piezoelectric layer that is opposite to the first side; a controller adapted to determine a subset of frequencies from the range of frequencies at which to output vibrations, and select, for the subset of frequencies, a respective input voltage for each of the two or more electrode pairs based on a relative position of each pair on the transducer, wherein respective input voltages for at least two of the two or more electrode pairs are different; and a drive module in electrical communication with each of the two or more electrode pairs, the drive module being adapted to apply the respective input voltage to each of the two or more electrode pairs to cause the transducer to generate a vibrational force on the load within the range of output frequencies, in which, in order to generate the vibrational force on the load within the range of output frequencies, the transducer is configured to undergo vibrations which displace the piezoelectric layer by varying amounts along the length of the transducer, and in which the controller is adapted to select the respective input voltages so as to reduce an activation of a piezoelectric response at a location on the transducer corresponding to an electrode pair where the activation is out of phase with a displacement of the piezoelectric layer.

Implementations of the system can include one or more of the following features. Each input voltage comprises can include an amplitude and a corresponding phase. The controller can be adapted to select respective input voltages to reduce a current drawn by the transducer for the vibrational force.

The subset of frequencies can include 0 kHz to 10 kHz or 4 kHz to 10 kHz.

The transducer can have 2 or 3 electrode pairs.

The piezoelectric layer can include a ceramic material.

In general, a further innovative aspect of the subject matter described in this specification can be embodied in methods that include the actions of determining, for a piezoelectric transducer of a distributed mode loudspeaker adapted to create forces to cause vibration of a load to generate sound waves within a range of frequencies, a subset of frequencies, from the range of frequencies, at which to output a sound; selecting, based on the subset of frequencies, one or more electrode pairs from two or more electrode pairs included in the piezoelectric transducer to generate the sound, each electrode pair including a first electrode on a first side of a layer included in the piezoelectric transducer and a second electrode on a second side of the layer opposite the first side, and connected to a different portion of the layer; and providing, by a drive module connected to each of the two or more electrode pairs, current to each of the selected one or more electrode pairs to cause the piezoelectric transducer to generate a force that, when provided to a load, causes the load to generate the sound within the subset of frequencies. Other embodiments of this aspect include corresponding computer systems, apparatus, and computer programs recorded on one or more computer storage devices, each configured to perform the actions of the methods. A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In general, one innovative aspect of the subject matter described in this specification can be embodied in a system that includes a distributed mode loudspeaker including: a piezoelectric transducer: that includes two or more electrode pairs each of which a) include a first electrode on a first side of a layer included in the piezoelectric transducer, b) include a second electrode on a second side of the layer opposite the first side, and c) are connected to a different portion of the layer; and is adapted to create forces to cause vibration of a load to generate sound waves within a range of frequencies; a controller configured to: determine, for the piezoelectric transducer, a subset of frequencies, from the range of frequencies, at which to output a sound; and select, based on the subset of frequencies, one or more electrode pairs from the two or more electrode pairs included in the piezoelectric transducer to generate the sound; and a drive module: connected to each of the two or more electrode pairs and adapted to provide current to at least some of the two or more electrode pairs to cause the piezoelectric transducer to generate a force that, when provided to the load, causes the load to generate a sound; and configured to provide current to each of the selected one or more electrode pairs to cause the piezoelectric transducer to generate a force that, when provided to the load, causes the load to generate the sound within the subset of frequencies. Other embodiments of this aspect include corresponding computer systems, methods, and computer programs recorded on one or more computer storage devices, each configured to perform the actions of the operations. The computer system may include one or more computers and can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

In general, one innovative aspect of the subject matter described in this specification can be embodied in an apparatus that includes a smartphone including: a display configured to present content; a piezoelectric transducer: that includes two or more electrode pairs each of which a) include a first electrode on a first side of a layer included in the piezoelectric transducer, b) include a second electrode on a second side of the layer opposite the first side, and c) are connected to a different portion of the layer; and is adapted to create forces to cause vibration of a load to generate sound waves within a range of frequencies; a controller configured to: determine, for the piezoelectric transducer, a subset of frequencies, from the range of frequencies, at which to output a sound; and select, based on the subset of frequencies, one or more electrode pairs from the two or more electrode pairs included in the piezoelectric transducer to generate the sound; and a drive module: connected to each of the two or more electrode pairs and adapted to provide current to at least some of the two or more electrode pairs to cause the piezoelectric transducer to generate a force that, when provided to the load, causes the load to generate a sound; and configured to provide current to each of the selected one or more electrode pairs to cause the piezoelectric transducer to generate a force that, when provided to the load, causes the load to generate the sound within the subset of frequencies; one or more application processors configured to execute an application for the smartphone; and one or more memories one which are stored instructions that are operable, when executed by the one or more application processors, to cause the one or more application processors to execute the application. Other embodiments of this aspect include corresponding computer systems, methods, and computer programs recorded on one or more computer storage devices, each configured to perform the actions of the operations. The computer system may include one or more computers and can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The foregoing and other embodiments can each optionally include one or more of the following features, alone or in combination. Selecting, based on the subset of frequencies, the one or more electrode pairs from the two or more electrode pairs included in the piezoelectric transducer to generate the sound may include selecting, based on the subset of frequencies, a subset of electrode pairs from the two or more electrode pairs. Determining the subset of frequencies, from the range of frequencies, at which to output the sound may include determining a high frequency range subset, from the range of frequencies, at which to output the sound. Selecting, based on the subset of frequencies, a subset of electrode pairs from the two or more electrode pairs may include selecting, based on the determined high frequency range subset, one electrode pair from the two or more electrode pairs. Selecting, based on the determined high frequency range subset, one electrode pair from the two or more electrode pairs may include selecting, based on the determined high frequency range subset, a particular electrode pair that is closest to a support a) fixedly connected to the piezoelectric transducer, b) connected to the load, and c) that transfers the force from the piezoelectric transducer to the load. The method may include determining a medium frequency range subset, from the range of frequencies, at which to output a second sound that is a different sound than the sound; selecting, based on the determined medium frequency range subset, two or more particular electrode pairs from three or more electrode pairs included in the piezoelectric transducer, the three or more electrode pairs including the two or more electrode pairs;

and providing, by the drive module that is connected to each of the three or more electrode pairs, current to each of the selected two or more electrode pairs to cause the piezoelectric transducer to provide a force to the load and the load to generate the second sound within the medium frequency range subset.

In some implementations, selecting, based on the subset of frequencies, the one or more electrode pairs from the two or more electrode pairs included in the piezoelectric transducer to generate the sound may include selecting, based on the subset of frequencies, all of the two or more electrode pairs. Determining the subset of frequencies, from the range of frequencies, at which to output the sound may include determining a low frequency range subset, from the range of frequencies, at which to output the sound. Selecting, based on the subset of frequencies, all of the two or more electrode pairs may include selecting, based on the determined low frequency range subset, all of the two or more electrode pairs.

In some implementations, the system includes the load. The system may include a smartphone. The load may be a display of the smartphone, e.g., configured to present content. The display may present content to a user operating the smartphone. The distributed mode loudspeaker may include a support fixedly connected to the piezoelectric transducer that, when connected to the load, transfers at least some of the force generated by the piezoelectric transducer to the load. At least some electrode pairs from the two or more electrode pairs may share a common ground, have a separate ground. Some of the electrode pairs may share a common ground and some of the electrode pairs may have separate grounds. Each electrode pair from the two or more electrode pairs may have a separate ground. The layer may be ceramic.

Among other advantages, the systems and methods described below may reduce distributed mode loudspeaker power usage, increase impedance in distributed mode loudspeakers, reduce capacitance in distributed mode loudspeakers, or a combination of two or more of these.

Advantages of the disclosed systems and methods can include reducing current use by the distributed mode loudspeaker, for example, during operation at higher frequencies while achieving a desired level of performance. Another advantage can include reducing power or energy or voltage use by the distributed mode loudspeaker, for example, during operation at higher frequencies while achieving a desired level of performance. An additional advantage can include increasing the total force produced by the DML for a given total applied voltage. Efficient use of the inertial energy of the transducer is also contemplated.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 1A-C show an example device that includes a distributed mode loudspeaker.

Like reference numbers and designations in the various drawings indicate like elements.

DETAILED DESCRIPTION

Figure 2A:
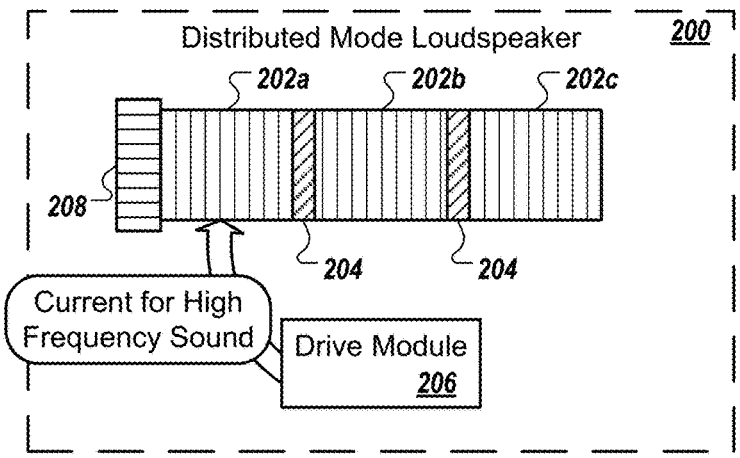
FIGS. 2A-C show a distributed mode loudspeaker separately energizing electrode pairs to actuate a transducer layer based on an output frequency subset.

FIGS. 1A-C show an example device 100 that includes a distributed mode loudspeaker 102. The device 100, such as a smartphone or another type of computer, uses the distributed mode loudspeaker 102, shown in FIG. 1C, to generate sound. The sound may be any type of sound, such as a phone conversation, music, an audio stream, sound for a video, or sound for a game.

The distributed mode loudspeaker 102 includes a panel 104 that vibrates (e.g., through bending waves) and generates sound waves. The panel 104 may be any appropriate panel included in the device 100 that can generate sound waves. For instance, the panel 104 may be a display panel included in the device 100. The display panel may include a touch screen or any other appropriate type of display.

The panel 104 is connected to a support 106, shown in FIGS. 1B-C, that transfers a force from a piezoelectric transducer 108 (or DMA) to the panel 104. The panel 104 is rigidly connected to the support 106 so that the support 106 can efficiently transfer force to the panel 104. In some implementations, the panel 104 may be removably connected to the support 106 during manufacturing of the device 100, e.g., the support 106 can be disconnected from the panel 104. In some examples, the panel 104 may be fixedly connected to the support 106, e.g., the support 106 is intended to be permanently fixed to the panel 104 without causing damage to remove the support 106 from the panel 104.

In some implementations, another component may be part of the connection between the panel 104 and the support 106. For example, the support 106 may rigidly connect to a chassis that rigidly connects to the panel 104.

The piezoelectric transducer 108 is connected to the support 106 on one end, in a cantilever-type structure (e.g., where the opposite end of the transducer is free to vibrate), to allow transfer of at least some of a force, generated by the piezoelectric transducer 108, from the piezoelectric transducer 108, through the support 106, and into the panel 104. The piezoelectric transducer 108 is rigidly connected to the support 106 so that the piezoelectric transducer 108 can efficiently transfer force to the support 106. In some examples, the piezoelectric transducer 108 is fixedly connected to the support 106, e.g., permanently fixed to the support 106 such that removal would cause damage to the support 106, the piezoelectric transducer 108, or both. The piezoelectric transducer 108 may be removably connected to the support 106, e.g., such that the piezoelectric transducer 108 may be disconnected from the support 106 without causing damage to either.

The piezoelectric transducer 108 generates the force by actuating in response to receipt of a signal from a drive module included in the distributed mode loudspeaker 102. For instance, the piezoelectric transducer 108 includes multiple electrode pairs 110-114 each of which is connected to the drive module to allow the corresponding electrode pair 110-114 to receive an activation signal, e.g., current, from the drive module. When an electrode pair 110-114 receives a signal from the drive module, the electrode pair 110-114 produces an electric field across at least a portion of a layer 116 of piezoelectric material of the piezoelectric transducer 108. The electric field causes a physical change in dimension of the piezoelectric material, and the associated displacement of the actuator generates a force.

The electrode pairs 110-114 may be connected to the layer 116 in any appropriate manner. For instance, the electrode pairs 110-114 may be fixedly connected to the layer 116 during manufacturing, e.g., through a deposition and patterning process. The electrode pairs 110-114 may include separate grounds. For example, the electrodes 110a, 112a, and 114a may be positive electrodes each of which has a corresponding ground electrode 110b, 112b, and 114b, respectively. The piezoelectric transducer 108 may include any appropriate combination of positive electrodes and ground electrodes. For instance, the electrodes 110a, 112b, and 114b may be positive electrodes while the other electrodes 110b, 112a, and 114a are ground electrodes. In some examples, the electrode pairs 110-114 may include a common ground. For example, the electrodes 110a, 112a, and 114a may be positive electrodes and the electrodes 110b, 112b, and 114b may be a single common ground electrode.

The layer 116 may be any appropriate type of piezoelectric material. For instance, the layer 116 may be a ceramic or crystalline piezoelectric material. Examples of ceramic piezoelectric materials include barium titanate, lead zirconium titanate, bismuth ferrite, and sodium niobate, for example. Examples of crystalline piezoelectric materials include topaz, lead titanate, lithium niobate, and lithium tantalite.

Electrode pairs 110-114 can include any appropriate electrically conductive material. For example, the electrodes can be metal, such as nickel, copper, or silver, or electrically-conducting polymers.

The actuation of the layer 116 by the electrode pairs 110-114 may be movement of a portion of the layer 116 in a vertical direction 118 perpendicular to a large surface of the layer 116. Different portions of the layer 116 actuate separately depending on the electrode pairs 110-114 that receive a signal from the drive module. For instance, when a first electrode pair 110a-b receives a signal from the drive module, the first electrode pair 110a-b may primarily cause a portion of the layer 116 that is closest to the support 106, and connected to the first electrode pair 110a-b, to actuate. When a second electrode pair 112a-b receives a signal from the drive module, the second electrode pair 112a-b may primarily cause a middle portion of the layer 116, connected to the second electrode pair 112a-b, to actuate. When a third electrode pair 114a-b receives a signal from the drive module, the third electrode pair 114a-b may primarily cause an end portion of the layer 116 that is farthest away from the support 106, and connected to the third electrode pair 114a-b, to actuate.

In some implementations, the various electrode pairs 110-114 primarily cause a respective portion of the layer 116 to actuate in response to receiving a signal because adjacent portions of the layer 116 may also actuate to a lesser degree than the respective portion of the layer 116 to which the electrode pair is connected. For example, when the first electrode pair 110a-b receives a signal from the drive module, the first electrode pair 110a-b primarily causes the portion of the layer 116 connected to the first electrode pair 110a-b to actuate and generate a force and may also cause some of the portion of the layer 116 connected to the second electrode pair 112a-b to actuate.

The distributed mode loudspeaker 102 includes multiple electrodes to allow separate selection, energization, or both, of different portions of the layer 116. For instance, the distributed mode loudspeaker 102 may selectively energize some of the electrodes for better reproduction of sounds at certain frequencies, to reduce power consumption, or both.

Figure 2B:
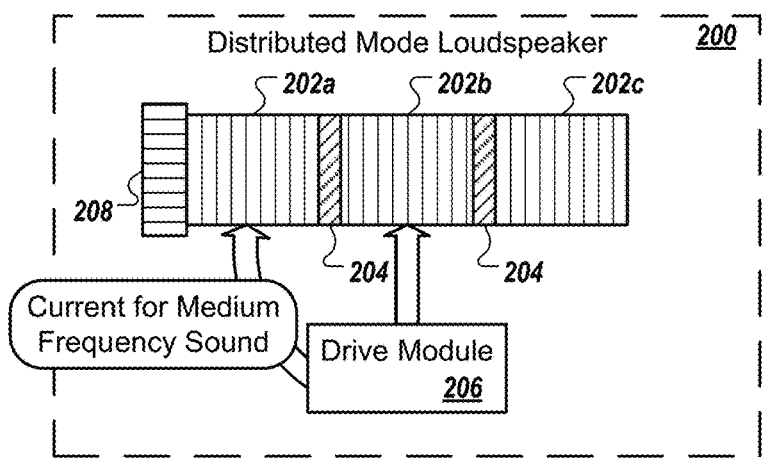
Figure 2C:
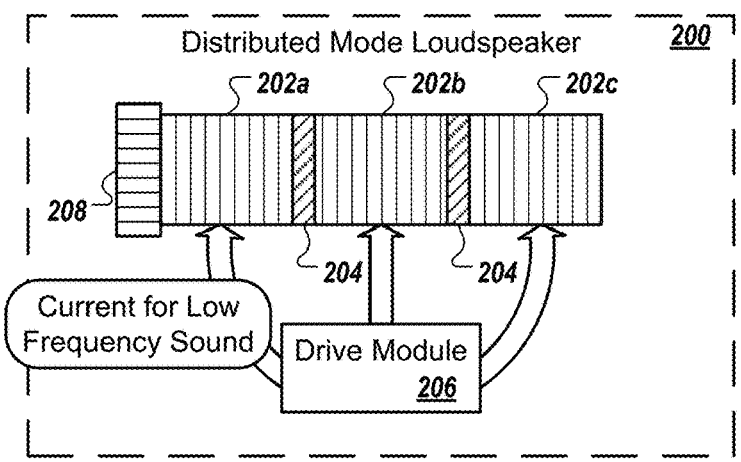

FIGS. 2A-C show a distributed mode loudspeaker 200 separately energizing electrode pairs 202a-c to actuate a transducer layer 204 based on an output frequency subset. The distributed mode loudspeaker 200 may be an example of the distributed mode loudspeaker 102 discussed with reference to FIG. 1. The electrode pairs 202a-c may correspond to the electrode pairs 110-114. The transducer layer 204 may correspond to the layer 116. The support 208 may correspond to the support 106.

A drive module 206, included in the distributed mode loudspeaker 200, may energize only some of the electrode pairs 202a-c when generating high frequency sounds, as shown in FIG. 2A. In some examples, the drive module 206 may energize a first electrode pair 202a for high frequency sound generation. The first electrode pair 202 may be closest to a support to which a piezoelectric transducer, that includes the electrodes 202a-c and the transducer layer 204, is connected. The drive module 206 may energize only some of the electrode pairs 202a-c to reduce power consumption when generating sound.

The drive module 206 may energize multiple electrode pairs 202a-b to generate medium frequency sounds, as shown in FIG. 2B. The multiple electrode pairs 202a-b may include two or more electrode pairs. The multiple electrode pairs 202a-b may include fewer than all of the electrode pairs 202a-c included in the distributed mode loudspeaker 200. In some examples, the drive module 206 may select and energize adjacent electrode pairs, e.g., two electrode pairs 202a-b closest to the support or two electrode pairs 202b-c furthest from the support 208, to generate a medium frequency sound. In some examples, the drive module 206 may select and energize two electrode pairs that are not adjacent to each other, e.g., a first electrode pair 202a and a third electrode pair 202c.

The drive module 206 may energize multiple electrode pairs 202a-c to generate low frequency sounds, as shown in FIG. 2C. The multiple electrode pairs 202a-c may include three or more electrode pairs. For example, the drive module 206 may select and energize all of the electrode pairs 202a-c included in the distributed mode loudspeaker 200 to generate a low frequency sound. The drive module 206 may select multiple electrode pairs 202a-c for more accurate reproduction of low frequency sounds by the distributed mode loudspeaker 200, e.g., to reproduce a wider range of low frequency sounds.

Figure 3:
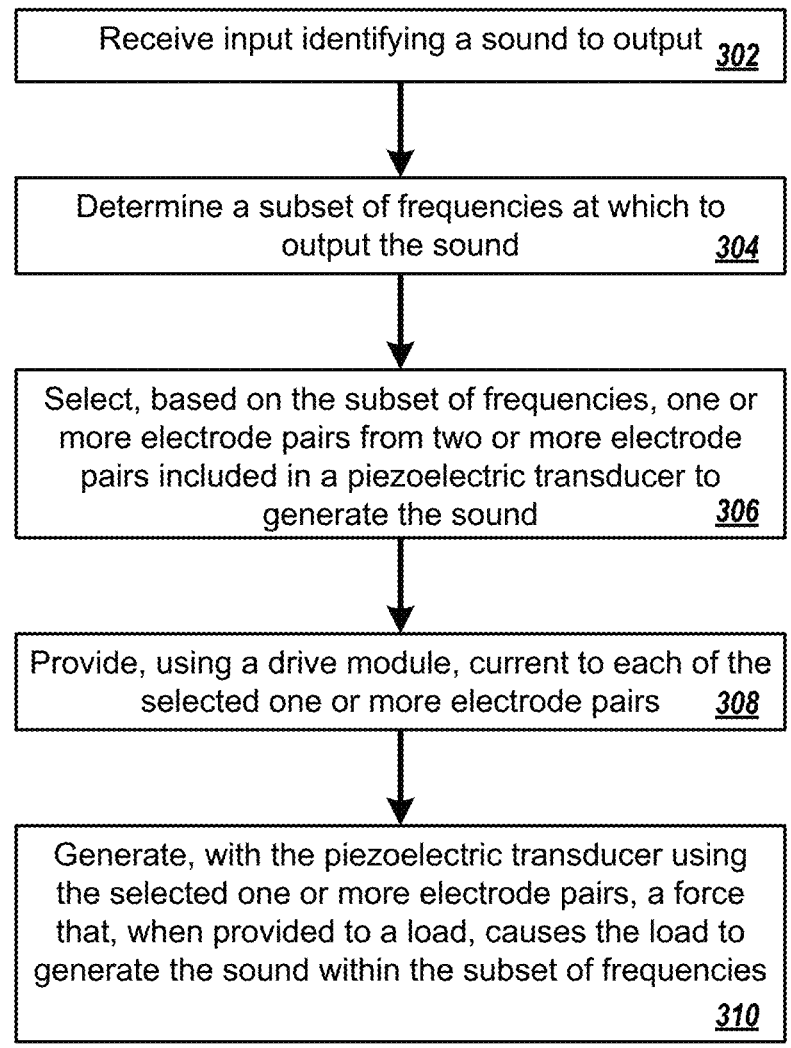
FIG. 3 is a flow diagram of a process for providing current to a subset of two or more electrode pairs included in a piezoelectric transducer.

FIG. 3 is a flow diagram of a process 300 for providing current or voltage to a subset of two or more electrode pairs included in a piezoelectric transducer. For example, the process 300 can be used by the distributed mode loudspeaker 102 from the device 100.

A distributed mode loudspeaker receives input identifying a sound to output (302). For example, a drive module or a controller, included in the distributed mode loudspeaker, may receive a signal that identifies the sound to output. The signal may be any appropriate type of signal for a speaker, a distributed mode loudspeaker, or both. The drive module or the controller may receive the input from an application executing on a device, e.g., a phone or music application on a smartphone. The drive module may be the same component in the distributed mode loudspeaker as the controller. In some examples, the drive module may be a different component than the controller in the distributed mode loudspeaker.

The distributed mode loudspeaker is configured to generate sound waves within a range of frequencies. For example, the manufacturing design of the distributed mode loudspeaker, potentially including configuration parameters for a panel, a support, and a piezoelectric transducer, all of which are included in the distributed mode loudspeaker, may correspond to the range of frequencies at which the distributed mode loudspeaker can generate sounds.

The distributed mode loudspeaker determines a subset of frequencies at which to output the sound (304). The subset of frequencies is a subset of frequencies from the range of frequencies at which the distributed mode loudspeaker can generate sounds. The subset of frequencies may be a proper subset of the range of frequencies at which the distributed mode loudspeaker can generate sounds. The drive module or the controller may use data from the signal to determine the subset of frequencies. For instance, the drive module or the controller may determine that the signal identifies the subset of frequencies at which to output the sound.

The distributed mode loudspeaker selects, based on the subset of frequencies, one or more electrode pairs from two or more electrode pairs included in a piezoelectric transducer to generate the sound (306). The drive module or the controller may use any appropriate method to select the one or more electrode pairs based on the subset of frequencies. In some examples, the drive module or the controller may use an algorithm that outputs, for a subset of frequencies, a number of electrode pairs to energize, identifiers for electrode pairs to energize, or both, to generate the sound. For instance, the drive module or the controller may use a mapping of frequency subset ranges, from the range of frequencies, to input values when selecting the one or more electrode pairs from the two or more electrode pairs included in the piezoelectric transducer.

In some examples, when the controller is a different component from the drive module and determines the subset of frequencies, the controller provides data for the subset of frequencies to the drive module. For instance, the controller that determines the subset of frequencies at which to output the sound and provides data for the subset of frequencies to the drive module. The data for the subset of frequencies may be data that identifies the subset of frequencies, e.g., data representing numerical values for the subset of frequencies. In response to receiving the data for the subset of frequencies, the drive module uses the data for the subset of frequencies to select the one or more electrode pairs included in the piezoelectric transducer to generate the sound.

The distributed mode loudspeaker includes the piezoelectric transducer. The distributed mode loudspeaker may include any appropriate number of electrode pairs greater than or equal to two. For example, the distributed mode loudspeaker may include two, three, four, five, six, or nine electrode pairs.

The distributed mode loudspeaker provides, using a drive module, current or voltage to each of the selected one or more electrode pairs (308). For example, the drive module provides the current to the positive electrodes from the selected one or more electrode pairs. When at least some of the electrode pairs share a common ground, the drive module provides input current to the separate positive electrodes, each of which is from one of the electrode pairs, and the distributed mode loudspeaker receives output current from the electrode pairs through the common ground. When the electrode pairs have separate ground electrodes, the distributed mode loudspeaker receives the output current from the separate ground electrodes, from the selected one or more electrode pairs, based on providing input current to the separate positive electrodes from the selected one or more electrode pairs.

The distributed mode loudspeaker generates, with the piezoelectric transducer using the selected one or more electrode pairs, a force that, when provided to a load, causes the load to generate the sound within the subset of frequencies (310). For instance, receipt of the current by the electrode pairs causes a layer, included in the piezoelectric transducer, to actuate and generate a force. A support, included in the distributed mode loudspeaker, may transfer the force, or at least a portion of the force, from the piezoelectric transducer to a panel. Receipt of the force or the portion of the force by the panel causes the panel to vibrate and generate the sound identified by the input.

In some implementations, the process 300 can include additional steps, fewer steps, or some of the steps can be divided into multiple steps. For example, the distributed mode loudspeaker may determine a subset of frequencies at which to output a sound and select one or more electrode pairs to generate the sound without performing the other steps in the process 300. In some examples, the distributed mode loudspeaker may perform steps 304, 306, and 308 without performing the other steps in the process 300.

One or more of the steps in the process 300 may be performed automatically in response to a prior step in the process 300. For example, the distributed mode loudspeaker may determine the subset of frequencies in response to receiving the input. The distributed mode loudspeaker may select the one or more electrode pairs from the two or more electrode pairs included in the piezoelectric transducer in response to determining the subset of frequencies. The drive module may provide current to each of the selected one or more electrode pairs in response to selecting the one or more electrode pairs. The piezoelectric transducer may generate the force in response to receiving the current from the drive module.

In general, efficiency of a DML can be improved (e.g., optimized) by judicious selection of drive voltage for each electrode pair as a function of acoustic output frequency. Consider, for example and with reference to FIGS. 4A and 4B, a distributed mode loudspeaker (or DML) 400 that has electrode pairs 401*a-b*, 402*a-b*, and 403*a-b* for energizing three different portions of a transducer layer 416. When an alternating voltage is applied to an electrode pair (e.g.,

401*a-b*, 402*a-b*, and 403*a-b*), a portion of transducer layer 416 corresponding to that electrode pair is energized to move with the same frequency as the frequency of the applied voltage. Other parts of the transducer will also move due to mechanical coupling.

Transducer layer 416 is part of a transducer (or DMA) 408 connected to a panel (or load) 404 via a support 406. The distributed mode loudspeaker 400 can be an example of the distributed mode loudspeaker 102 discussed with reference to FIG. 1. Electrode pairs 401*a-b*, 402*a-b*, and 403*a-b* can correspond to electrode pairs 110-114. Transducer layer 416 can correspond to transducer layer 116. Support 406 and panel 404 can correspond to support 106 and panel 104.

In general, depending on the output acoustic frequency and geometry of transducer layer 416, the relative displacement and velocity of portions of the transducer layer 416 in the z-direction (e.g., the vibration profile) vary along the length of the layer. Accordingly, different portions of the transducer layer can be moving "in phase" or "out of phase" with one another depending on the output frequency.

Figure 4A:
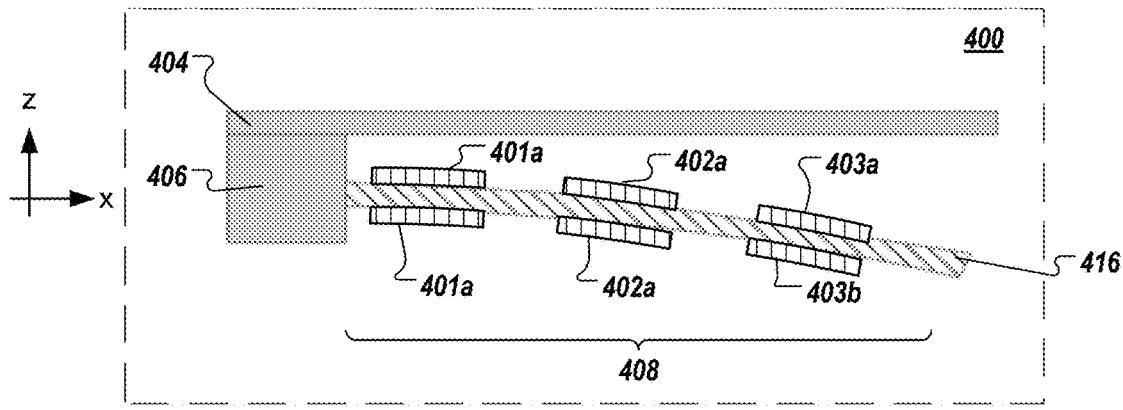
FIGS. 4A-4B are schematics of a distributed mode loudspeaker at two different acoustical output frequencies.
Figure 4B:
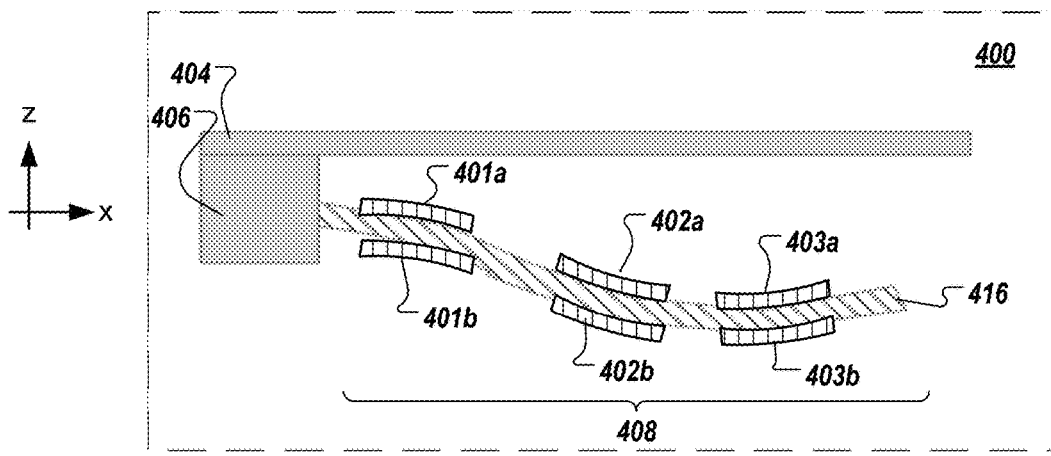

FIGS. 4A-4B illustrates this principle by showing a simplified example of the instantaneous movement of transducer layer 416 for a lower and higher output frequency, respectively. As shown in FIG. 4A, at lower output acoustic frequencies (e.g., below 4 kHz), most portions of transducer layer 416, and thus electrode pairs 401*a-b*, 402*a-b*, and 403*a-b* move "in phase" in the z-direction. In other words, the portions of transducer layer 416 all have the same direction of velocity in the z-direction. FIG. 4A shows a snapshot of when portions of transducer layer 416 are all simultaneously moving downwards. At higher output frequencies (e.g., above 4 kHz), however, different portions of transducer layer 416 (along x-axis), corresponding to different electrode pairs 401*a-b*, 402*a-b*, 403*a-b*, move with different "phases" in the z-direction, as illustrated in FIG. 4B. For example, while the portion of transducer layer 416 corresponding to electrode pair 401*a-b* is moving upwards, the portions corresponding to electrode pairs 402*a-b*, 403*a-b* are moving downwards. It is believed that higher output frequencies can result in such out of phase motion due to the action of different modes in the transducer layer 416. Such out of phase motion can result in parts of transducer layer 416 working against the primary (or intended) action of the rest of the layer and/or not contributing to the primary (or intended) action, as illustrated in FIG. 4B. "Primary action" refers to the average momentum or velocity of transducer layer 416.

When a portion of transducer layer 416 is moving in the opposite direction to the intended of primary motion of the rest of the layer (e.g., the portion of transducer layer 416 corresponding to electrode pair 401*a-b*), for example for higher output frequencies, voltage applied to the electrode pair to energize that portion of the layer may not be contributing to the desired acoustic output. Efficiency can dictate that turning off the voltage applied to that electrode, or applying a voltage of opposite alternating polarity, can reduce the energy wasted by the portion moving "out of phase" with the primary action of transducer layer 416. In an alternative or additional empirical approach, input voltages can be selected to reduce the activation of the piezoelectric response, e.g., the piezoelectric force due to the applied voltage, at a location on the transducer corresponding to an electrode pair where the activation or force at that location is out of phase with the displacement of the piezoelectric layer. In other words, voltage input can be reduced on locations of the transducer moving in the opposite direction of, or out of phase with, the force applied to that location.

Thus, in general, it may be advantageous, at output frequencies that result in portions of transducer layer 416 moving "out of phase" (e.g., at higher output frequencies), to drive transducer layer 416 with different voltages applied to different electrode pairs 401*a-b*, 402*a-b*, 403*a-b* instead of driving the whole transducer with a single voltage. This principle can be expanded to other output frequencies and transducer layer geometries. In some embodiments, optimization can be achieved empirically by observing the vibration profile of the transducer at different output frequencies and modifying applied voltages accordingly. In some embodiments, optimization can be achieved analytically and/or through simulation using optimization algorithms.

In general, each electrode pair 401*a-b*, 402*a-b*, 403*a-b* produces a capacitance across transducer layer 416. For example, the capacitance originating from a single electrode pair can be between 100 nF and 1000 nF, or between 200 and 450 nF (e.g., 430 nF). The capacitance can be additive (e.g., in series) over the three electrodes. For example, the total capacitance (or electrical load) of transducer 408 can be between 300 nF and 3 μF, or between 0.75 and 1.5 μF (e.g., adding up to 1.3 μF).

At higher output frequencies, a higher capacitance of transducer 408 can require a larger flow of current. For example, electronic amplifiers connected to transducer 408 can produce a controlled output voltage that is limited by the supply rail. The capacitive load of the transducer can present an electrical impedance that is inversely proportional to frequency. Thus, the current drawn by the amplifier can increase in proportion to frequency. In some embodiments, an advantage of judicious selection of driving voltages for the electrode pairs of the transducer layer as a function of acoustic output frequency can include reducing current flow (or draw) during operation at higher output frequencies (e.g., above 4 kHz).

Without wishing to be bound by any particular theory, the reactive power (Pr) required by transducer 408 to apply a given force on load 404 at an acoustic output frequency f can be expressed as $$Pr = \frac{CV^2}{2} \cdot f,$$

where C is the total capacitance of transducer 408 and V is the input voltage. The equation indicates that, at higher output frequencies f, a higher capacitance C requires a higher power Pr to produce a given force. In some embodiments, an advantage can include reducing required power during operation at higher frequencies (e.g., above 4 kHz). Power Pr and current I are related as follows:

$$Pr = \frac{V \cdot I}{2}.$$

Thus, reducing current flow, as discussed above, is related to reducing power consumption.

Figure 5A:
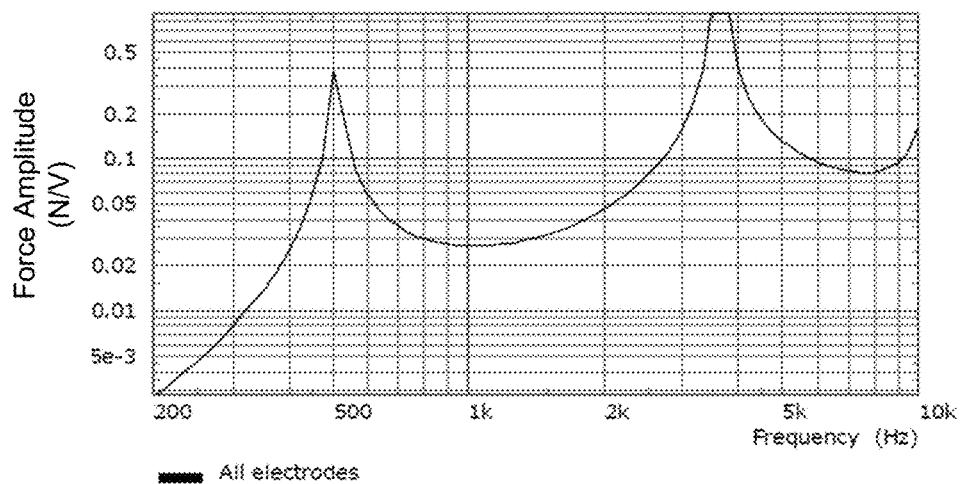
FIG. 5A is a simulation plot of the total amplitude of the force (per volt) generated by a distributed mode loudspeaker (DML) as a function of output acoustic frequencies.

Referring to FIG. 5A, a simulated plot of the total amplitude of the force (per volt) generated by a DMA (e.g., transducer 408) of a distributed mode loudspeaker as a function of output acoustic frequencies is shown. In the simulation, the DMA had three electrode pairs (e.g., 401*a-b*, 402*a-b*, 403*a-b*) of equal area and a total capacitance (or electrical load) of 1.3 μF, all driven at the same oscillating input voltage.

Figure 5B:
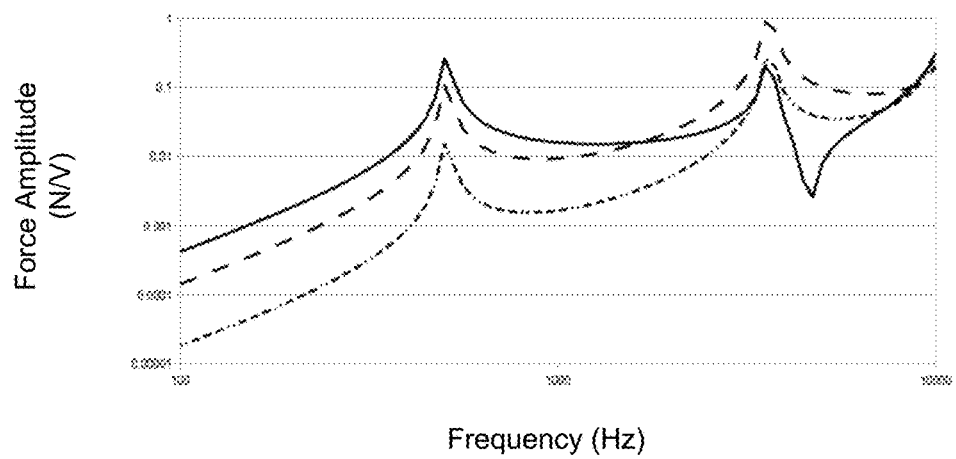
FIG. 5B is a simulation plot of the amplitude of the force generated individually by each electrode pair for the DML of FIG. 5A as a function of output acoustic frequency.

Referring to FIG. 5B, the amplitude of the force generated individually by each electrode pair 1, 2, and 3 (e.g., 401a-b, 402a-b, 403a-b) as a function of output acoustic frequency for the DMA of FIG. 5A is shown. The plot shows that, when driven at the same oscillating input voltage, the efficiency of the output of each electrode pair can be different and can depend on output acoustic frequency. For example, although electrode pair 1 (e.g., 401a-b) produces higher power output than the other electrode pairs at lower acoustic output frequencies, at higher acoustic output frequencies (e.g., above 4 kHz), that same electrode produces less power output that the other electrode pairs 2 and 3 (e.g., 402a-b, 403a-b).

Figure 6:
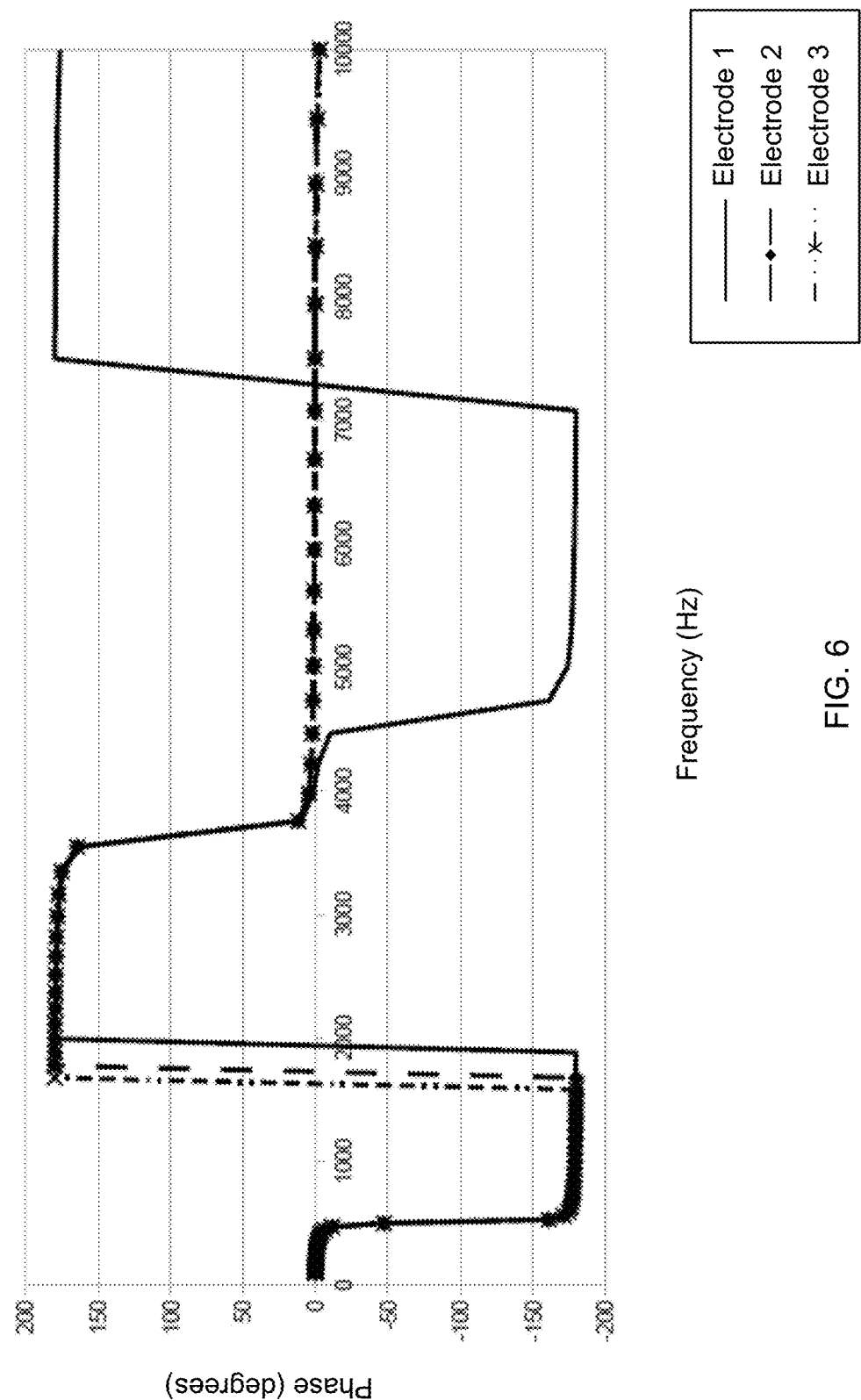
FIG. 6 is a simulation plot of the relative phase of each electrode pair of the DML modeled in FIGS. 5A-5B as a function of output acoustic frequency.

Referring to FIG. 6, the relative phase of each electrode pair 1, 2, and 3 of the DMA modeled in FIGS. 5A-5B as a function of output acoustic frequency is shown. "Relative Phase" as used with reference to electrode pairs (e.g., 401a-b, 402a-b, 403a-b) refers to the force delivered to the load (e.g., 404) by the transducer at the location of that pair. For example, at lower frequencies, all force contributions are in-phase with each other. At higher frequencies, the contribution from electrode-pair 1 is 180° out of phase (i.e., inverted).

As seen in FIG. 6, above 4 kHz output frequencies, the phase of electrode 1 becomes the opposite of the phase of electrodes 2 and 3. In other words, electrode 1 is working against the primary action of the transducer (e.g., producing an opposing force and/or momentum).

Figure 7:
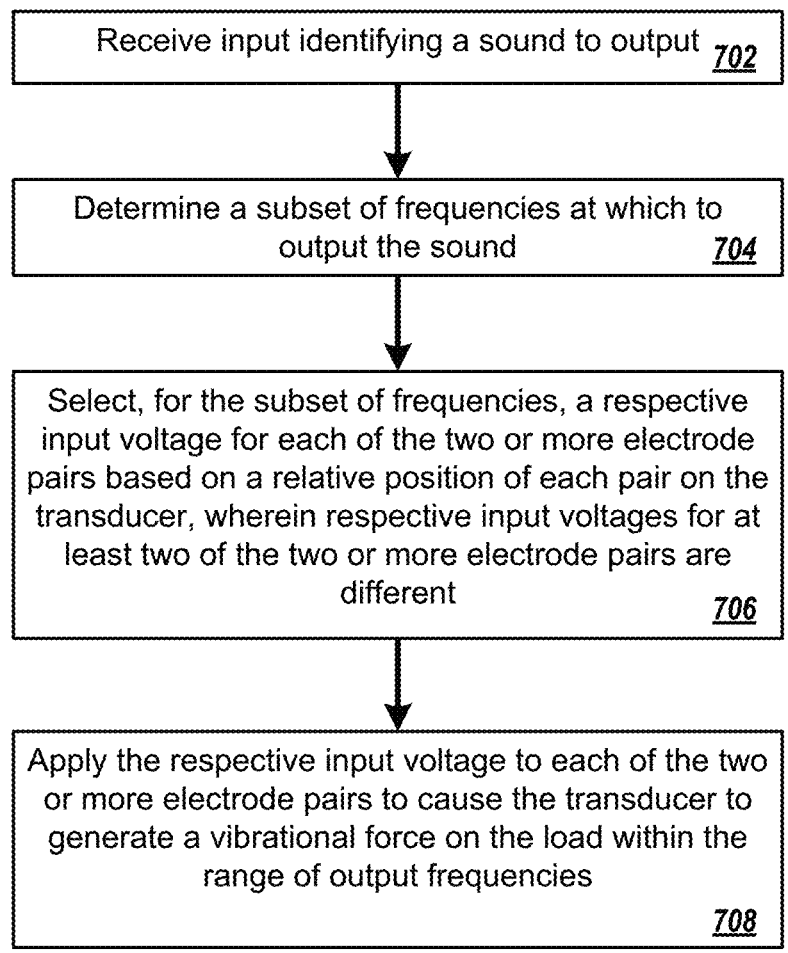
FIG. 7 is a flow diagram of a process for selecting different input voltages for each electrode pair of a DML.

Referring to FIG. 7, in some embodiments, a method 700 selects different input voltages for each electrode pair (e.g., 401a-b, 402a-b, 403a-b) of a DMA (e.g., 408) depending on the acoustic frequency output of the DMA. The selection can, for example, result in increased total force produced by the DMA and/or in reduced current used (e.g., "current load" or "current draw") by the DMA to produce a given output force. For example, the process 700 can be used by the distributed mode loudspeaker 400 shown in FIGS. 4A-4B.

A distributed mode loudspeaker receives input identifying a sound to output (702). For example, a drive module (e.g., 206) or a controller, included in the distributed mode loudspeaker, may receive a signal that identifies the sound to output. The signal may be any appropriate type of signal for a speaker, a distributed mode loudspeaker, or both. The drive module or the controller may receive the input from an application executing on a device, e.g., a phone or music application on a smartphone.

The distributed mode loudspeaker determines a subset of frequencies at which to output the sound (704). The subset of frequencies is a subset of frequencies from the range of frequencies at which the distributed mode loudspeaker can generate sounds. The drive module or the controller can use data from the signal to determine the subset of frequencies. For instance, the drive module or the controller can determine that the signal identifies the subset of frequencies at which to output the sound.

In some embodiments, the range of frequencies at which the distributed mode loudspeaker can generate sounds is between 0 kHz and 20 kHz, e.g., 20 Hz to 10 kHz, or 50 Hz to 10 kHz, or 200 Hz and 10 kHz.

The transition between "lower" and "higher" frequencies, where out of phase behavior of parts of the transducer begin to appear, can occur at mode frequencies. For implementations with a low fundamental resonance frequency (e.g., 4 kHz), there may be further transitions within the audio band at higher order modes (e.g., 10 kHz). In some embodiments, the subset of frequencies at which to output sound is between 0 kHz to 4 kHz (e.g., "lower frequencies"), or, between 4 kHz to 10 kHz (e.g., "higher frequencies"). In some embodiments, a lower subset of frequencies is between 4 kHz to 10 kHz, and higher subset of frequencies is between 10 kHz and 20 kHz.

The distributed mode loudspeaker selects (706), for the subset of frequencies, respective input voltage for each of the two or more electrode pairs (e.g., 401a-b, 402a-b, 403a-b) based on a relative position of each pair on the transducer, wherein respective input voltages for at least two of the two or more electrode pairs are different.

In some examples, the drive module or the controller can use an algorithm that outputs, for a subset of frequencies, a different oscillating input voltage (e.g., with a respective amplitude and relative phase) to each electrode pair to energize the respective portion of the DMA. In some embodiments, the input voltages can be selected to increase the total force produced by the DMA for a given total applied voltage and/or reduce the current used by the DMA to apply a given force. For example the algorithm can be a systematic optimization algorithm described in U.S. Pat. No. 9,041,662, incorporated herein in its entirety by reference.

In some embodiments, the input voltage for an electrode pair is an oscillating input voltage. In some embodiments, the input voltage has a corresponding amplitude and a corresponding phase. The amplitude of the input voltage ranges between −15 V and +15 V. The voltage can depend on the piezoelectric layer thickness, and the limit of applied voltage can be specified in terms of electric field strength, e.g., 500 kV/m. The phase of the input voltage ranges between −180° and +180°. The phase difference can range between −90° and +900.

Alternatively or in addition, an electrode pair (e.g., electrode pair 401a-b) on the DMA can be left unpowered when it moves out of phase with the primary action of the DMA, e.g., at frequencies above 4 kHz. Alternatively or in addition, an electrode pair (e.g., electrode pair 401a-b) on the DMA can be can be energized with an oscillating voltage that is out of phase with the input voltage of the other electrode pairs (402a-b, 403a-b) when it moves out of phase of the primary action of the DMA, e.g., at frequencies above 4 kHz. Without wishing to be bound by any particular theory, leaving an out-of-phase electrode pair unpowered or powered with a different phase of voltage at a certain frequency subset can help reduce current draw of the DML.

In some examples, as detailed in relation to FIG. 3, when the controller is a different component from the drive module and determines the subset of frequencies, the controller provides data for the subset of frequencies to the drive module.

The distributed mode loudspeaker applies (708), using the drive module, the respective input voltage to each of the two or more electrode pairs to cause the transducer to generate a vibrational force on the load within the range of output frequencies. The vibrational force, when provided to a load, causes the load to generate the sound within the subset of frequencies.

In some implementations, the process 700 can include additional steps, fewer steps, or some of the steps can be divided into multiple steps.

Figure 8A:
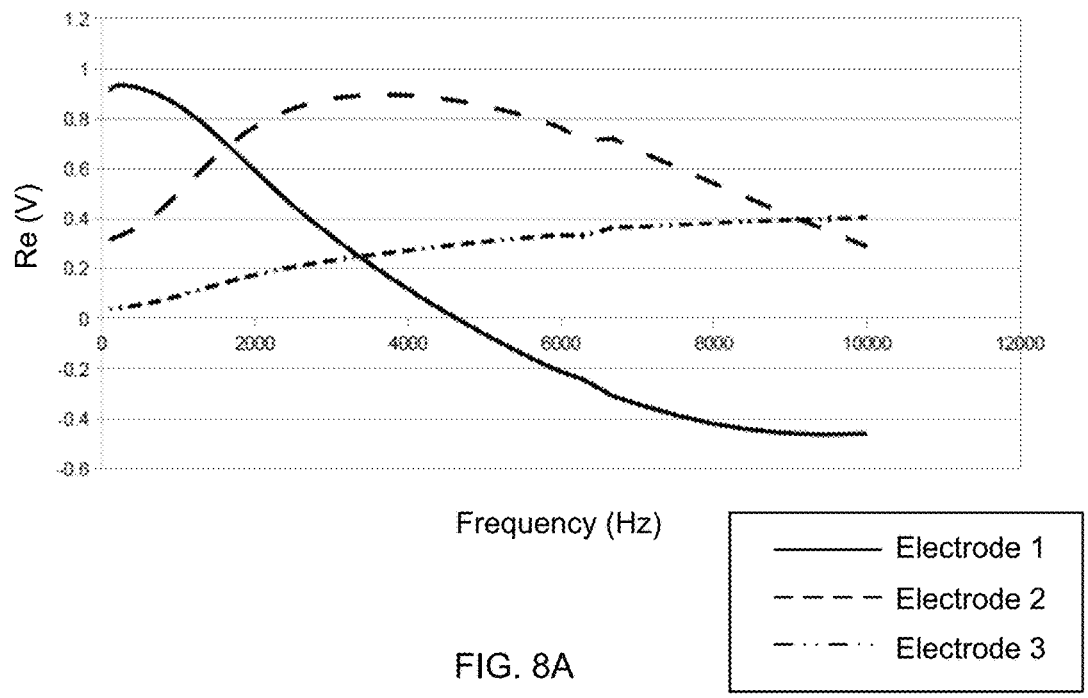
FIGS. 8A-B are simulated plots of the real and imaginary parts, respectively, of the input voltage for each electrode pair in a DML as a function of output frequency.
Figure 8B:
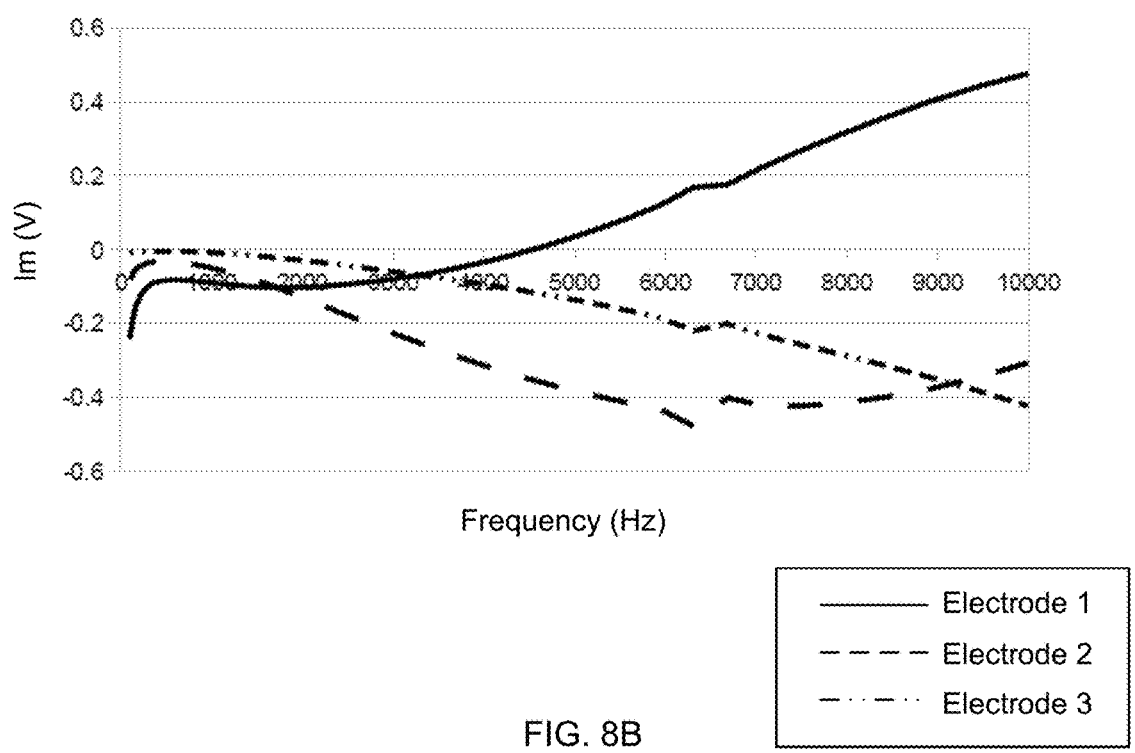

Referring to FIGS. 8A-8B, a systematic optimization algorithm described in U.S. Pat. No. 9,041,662 was used to select, in simulation, an oscillating input voltage for each equally-sized electrode 1-3 (e.g., corresponding to pairs 401a-b, 402a-b, 403a-b) of a DML (e.g., 400) to reduce current draw by the DML and/or to increase the force produced by the DML. In general, the algorithm described in U.S. Pat. No. 9,041,662 can be used to maximize or minimize a target response within the constraint that the input "power" is kept constant. In the example shown in FIGS. 8A-8B, the target response was the force, and the inputs were voltages. For comparison purposes, the voltages for the three electrode pairs were normalized such that their amplitude (or magnitude) sum squared is unity. In FIG. 8A, the real part $V_r$ of the input voltage, expressed as a gain, for each electrode 1-3 (e.g., corresponding to pairs 401a-b, 402a-b, 403a-b) is plotted as a function of output frequency. In FIG. 8B, the imaginary part $V_{im}$ of the input voltage, expressed as a gain, for each electrode 1-3 (e.g., corresponding to pairs 401a-b, 402a-b, 403a-b) is plotted as a function of output frequency. The total power gain is unity by virtue of the algorithm. These gains can be applied simultaneously to any input signal such as music As shown in FIGS. 8A-8B, different voltages were applied to each electrode, and the voltage inputs depended on the output frequency of the DML (e.g., 400). The amplitude (or magnitude) of the applied voltage for each electrode pair at a given frequency was $$\sqrt{(V_r)^2 + (V_{im})^2}$$

and the relative phase $\theta$ was $$\tan^{-1}\left(\frac{V_{im}}{V_r}\right).$$

Figure 9A:
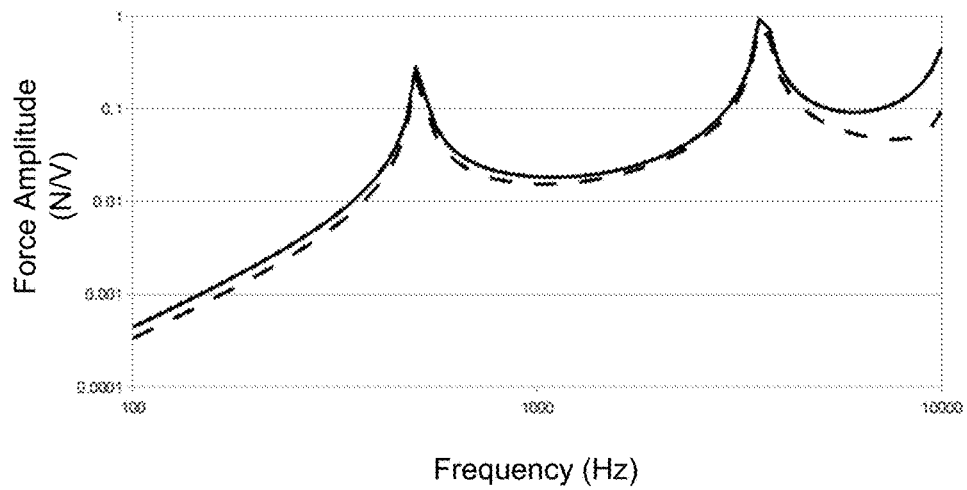
FIGS. 9A-9B are plots of the simulated total force output and current draw, respectively, for a DML as a function of acoustic output frequency.
Figure 9B:
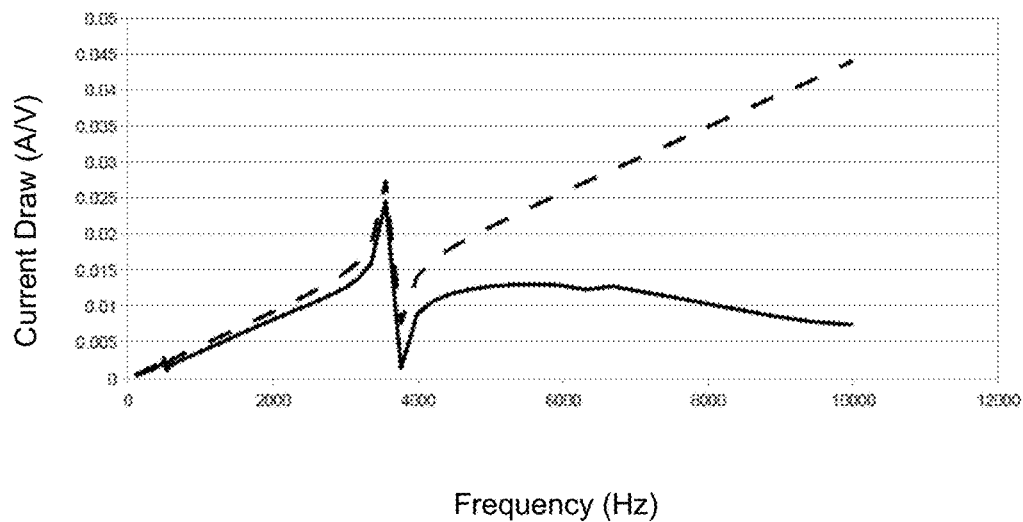

FIGS. 9A-9B compare the simulated total DML force output and current draw, respectively, for two choices of voltage input sets for each electrode pair as a function of acoustic output frequency. Again, for comparison purposes, the voltage sets for the three electrode pairs were normalized such that their sum squared is unity. The solid "optimized" curves resulted from the application of input voltages shown in FIGS. 8A-8B to the three electrode pairs 1-3. The dashed "equal" curves correspond to the application of equal, in-phase constant voltages (e.g., $$\frac{1}{\sqrt{3}}$$

each in magnitude) for each of the three electrode pairs 1-3.

Referring to FIG. 9A, the "optimized" choice of voltages resulted in higher output force for the DMA at all frequencies for the same total input voltage magnitude as the "equal" curve. Referring to FIG. 9B, the current draw of the "optimized" choice of voltages was lower than the "equal" curve, especially for output frequencies above 4 kHz. In other words, a DML with an "optimized" choice of voltages was shown to be more efficient at generating a higher force with a lower current draw than a DML using the same constant voltages for all three electrode pairs.

Although FIGS. 4A-4B, show a DMA 408 with three electrode pairs, 401a-b, 402a-b, 403a-b, of equal size, other numbers of electrode pairs and/or electrodes of differing size are contemplated. In some embodiments, systematic optimization algorithms, such as the one described in U.S. Pat. No. 9,041,662, can be used select the number of electrode pairs and the position and area of electrode pairs in order to increase the total force produced by the DMA and/or reduce the current used by the DMA to apply a given force. Without wishing to be bound by any particular theory, it can be advantageous to use fewer electrode pairs because each pair can require a separate electrical input, potentially adding cost and complexity to the DML.

Figure 10A:
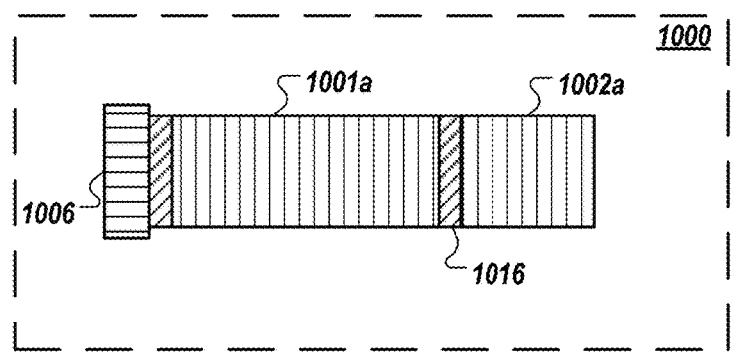
FIG. 10A is a schematic of a DML with two electrode pairs.

Referring to FIG. 10A, a distributed mode loudspeaker (or DML) 1000 has two electrode pairs 1001a and 1002a for energizing two different portions of a transducer layer 1016. Transducer layer 416 is part of a transducer (or DMA) connected to a panel (or load) via a support 1006. The distributed mode loudspeaker 1000 can be an example of the distributed mode loudspeaker 102 discussed with reference to FIG. 1, but with two electrode pairs.

In some embodiments, the size (e.g., area) of electrode pairs 1001a and 1002a is equal. In some embodiments, the electrode pairs 1001a and 1002a are of unequal size. Without wishing to be bound by any particular theory, the size (area) of the electrode pair can determine its capacitance. As discussed above, higher capacitance can lead to higher current use and or energy use requirements.

In some embodiments, when electrode pairs (e.g., 1001a and 1002a) are of different size, a method of selecting input voltages for the electrodes can consider the different capacitance of the electrode pairs.

In some embodiments, an optimization algorithm (e.g., described in U.S. Pat. No. 9,041,662) can be used to determine input voltages for electrode pairs (e.g., 1001a and 1002a) to optimize one of: (1) voltage use, for example increasing force produced by the DMA for a given total applied voltage, (2) current use, for example reducing the current used by the DMA to apply a given force, or (3) energy use, for example reducing the total energy used by the DMA to apply a given force, where energy is current multiplied by voltage.

In some embodiments, the normalization technique used for the optimization algorithm depends on which of the above (1)-(3) is being optimized. For voltage use optimization, the sum of squares of the voltages $V_i$ applied to each electrode i is equal to unity:

$$\sum_i |V_i|^2 = 1.$$

For current use optimization, the sum of the capacitance $C_i$ and voltage $V_i$ of each electrode i is normalized as:

$$\sum_i (C_i \cdot |V_i|)^2 = 1.$$

For energy use optimization, the normalization is:

$$\sum_i C_i \cdot |V_i|^2 = 1.$$

In some embodiments, if the electrodes all have the same capacitance C, all three optimizations can lead to the same ratio of input voltages for the electrode pairs.

In some embodiments, optimization can also consider configuration of external electrical circuitry outside of the DMA (e.g., wires in amplifier of a mobile phone incorporating the DMA). In some embodiments, optimization can also consider financial cost of implementation.

In some embodiments, the mode-shapes (e.g., bending response and/or inertia) of a cantilever-type transducer (e.g., 416) can be used to determine where to position electrode pairs on the transducer. In other words, where to "split" a continuous electrode located along the entire length of the transducer. In some embodiments, the transducer has different mode shapes depending on output frequency. Without wishing to be bound by theory, such optimization based on mode-shapes can allow for more efficient use of the energy of the transducer.

Figure 10B:
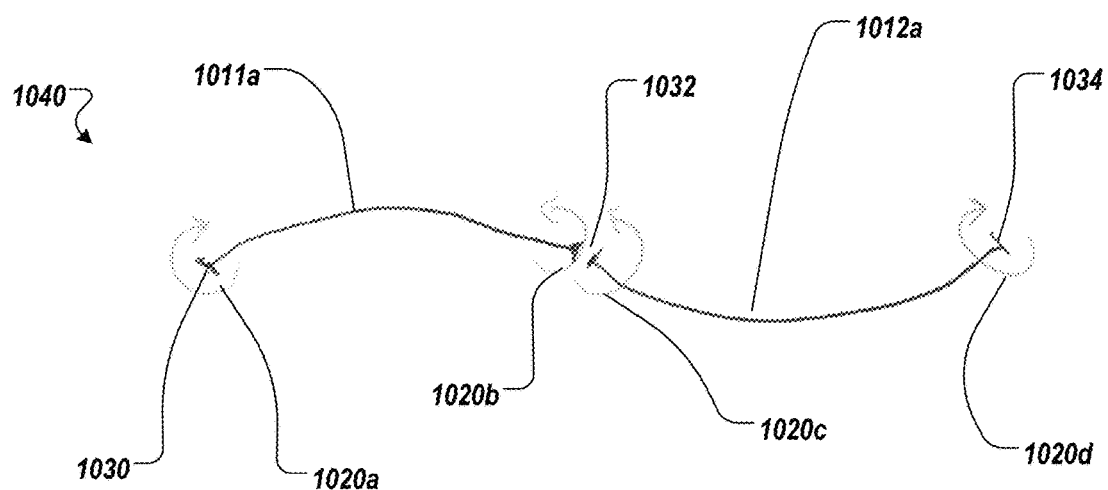
FIG. 10B is a moment diagram for a two-section piezoelectric transducer.

Referring to FIG. 10B, a moment diagram for a two-section piezoelectric transducer 1040 is shown. Two sections 1011a and 1012a of transducer 1040 can correspond to two electron pairs (e.g., 1001a and 1002a). At higher frequencies, sections 1011a and 1012a have opposite phase (e.g., are moving in opposite directions). Each section 1011a and 1012a provides opposing moments at its ends, 1020a and 1020b for section 1011a, and 1020c and 1020d for section 1012a. The direction of the bending moment for each end is shown with arrows in the plane of the page. The two sections 1011a and 1012a can be split at position 1032.

In some embodiments, position 1032 can be selected at a local maximum of the bending moment of transducer 1040. Without wishing to be bound by theory, a local maximum occurs when moments 1020b and 1020c, of two sections 1011a and 1012a respectively, are in phase (e.g., have same direction) and reinforce one another.

In some embodiments, an analytical model can be used to determine the local maxima of the bending moment of transducer 1040. For example, a formula for the mode shape Y (e.g., z-axis displacement) as a function of the normalized position ξ on the transducer is:

$$Y(\xi) = \cos h(\lambda\xi) - \cos(\lambda\xi) - \sigma(\sin h(\lambda\xi) - \sin(\lambda\xi))$$

where ξ is between 0 and 1, a tends towards +/−1, and λ is an eigenvalue multiplier of odd multiples of π/2 (e.g., 3π/2, 5π/2, etc.) depending on the mode number (corresponding to a different mode shape). The equation is adapted from *Formulas for Natural Frequency and Mode Shape* by Robert D. Blevins (ISBN: 9781575241845), p. 108.

The local maximum of the bending moment can be derived by finding a maximum of the second derivative of Y.

$$Y''(\xi) = \cos h(\lambda\xi) + \cos(\lambda\xi) - \alpha(\sin h(\lambda\xi) + \sin(\lambda\xi))$$

The local maxima (e.g., antinodes) of Y'' (e.g., where split 1032 can be located on transducer 1040) occur roughly where ξ equals multiples of 1/N for the Nth mode. Table 1 shows the actual values of ξ to 3 decimal place for the first 4 modes.

TABLE 1

| Mode number | 1$^{st}$ anti-node | 2$^{nd}$ anti-node | 3$^{rd}$ anti-node | 4$^{th}$ anti-node |
|---|---|---|---|---|
| 1 | 1 | | | |
| 2 | 0.529 | 1 | | |
| 3 | 0.308 | 0.709 | 1 | |
| 4 | 0.220 | 0.499 | 0.792 | 1 |

Based on this analytical model, it appears that splitting transducer 1040 at 1/N positions is close to optimal in terms of the mode-shape mechanics of the transducer. In other words, an electrode covering the length of transducer 1040 can be split at approximately the middle of the length of transducer 1040, to create two equal electrode pairs. Alternatively, or additionally, an electrode covering the length of transducer 1040 can be split at approximately the ⅓ and ⅔ of the length of transducer 1040, to create three equal electrode pairs.

Figure 11A:
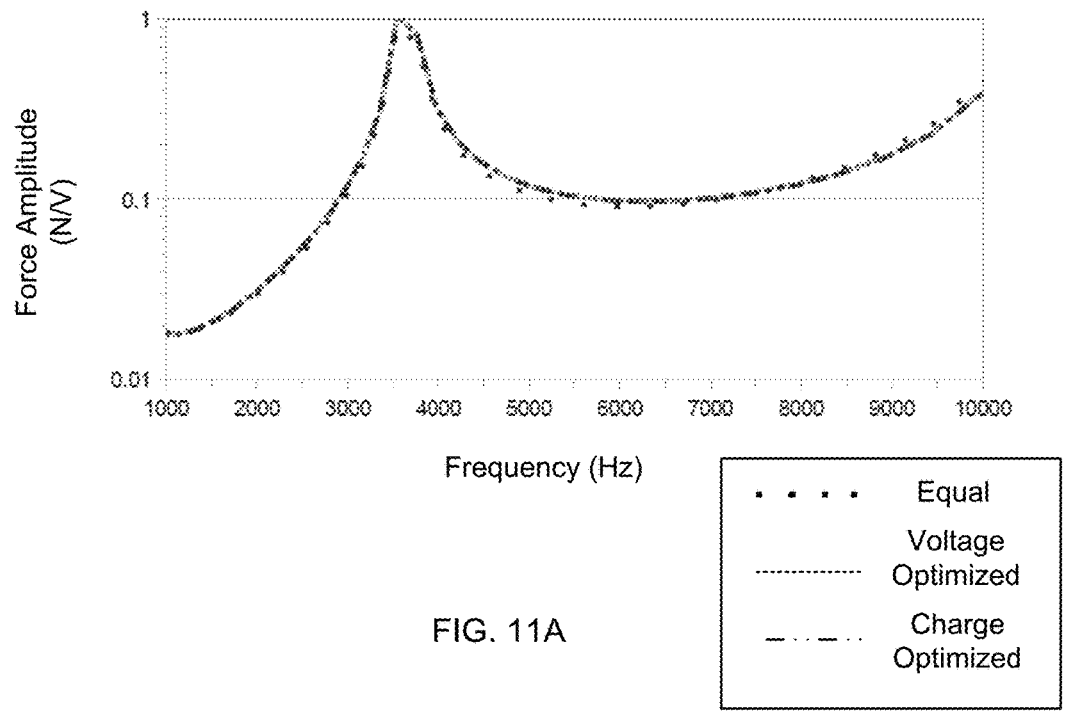
FIGS. 11A-11B are plots of the total force per volt and current draw, respectively, produced by a DML with two electrode pairs as a function of frequency.

Referring to FIG. 11A, the simulated total force per volt produced by a DMA (e.g., 1000) with two electrode pairs (e.g., 1001a and 1002a) is shown as a function of frequency. The dotted "equal" curve is the force produced with a DMA with two electrode pairs of equal size. Without wishing to be bound by theory, the "equal" curve can represent either a voltage use or a current use optimization, as they resulted in the same curve for equal sized electrode pairs. The dashed "voltage optimized" and "charge optimized" curves represent the force produced with a DMA where electrode pairs are split at 0.529, as prescribed by the analytical model above. The optimization was performed with an optimization algorithm described in U.S. Pat. No. 9,041,662, as described above. All three curves are approximately equal in FIG. 11A.

Figure 11B:
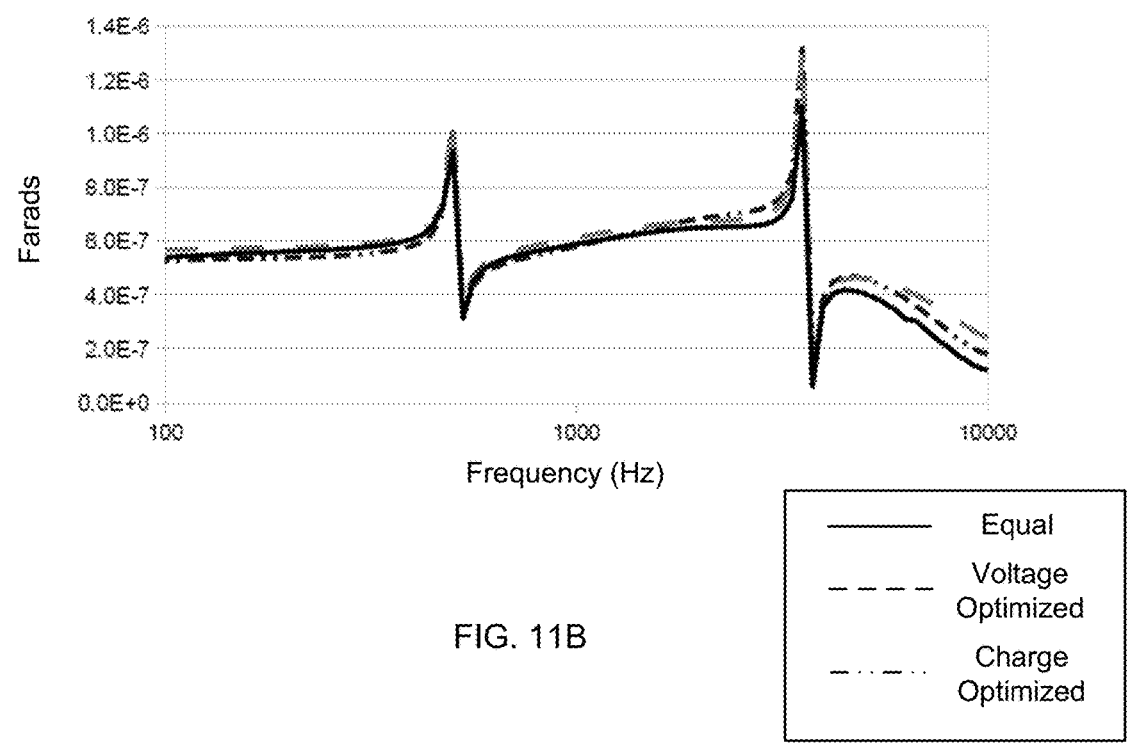

FIG. 11B shows the total current drawn by a DMA (e.g., 1000) with two electrode pairs (e.g., 1001a and 1002a) as a function of frequency. The curves correspond to the same type of DMA electrode splitting as in FIG. 11A. Again, all of the curves are approximately equal.

Without wishing to be bound by any particular theory, the results in FIGS. 11A-11B indicate that splitting the electrode into equal parts results in similar advantages to using the exact values found by the analytical model. This similarity may result from the fact that the DMA is only approximately a cantilever beam.

Although the above mentioned embodiments contemplated a beam-like, rectangular DMA geometry, devices in which the width is a significant fraction of the length (e.g., plate-like) are also contemplated. For example, rectangular and trapezoidal geometries are contemplated, as shown in U.S. Pat. No. 7,149,318, incorporated herein in its entirety by reference. The teachings about splitting of the electrode into pairs based on the analytical model above can also be applied by direct analogy to such other geometries.

In some implementations, when the distributed mode loudspeaker is included in a smartphone, the smartphone may include a display, e.g., a display panel, one or more processors, and one or more memories. The display may be a load used by the distributed mode loudspeaker to generate sound. In some examples, the smartphone may include a load different from the display for the distributed mode loudspeaker to use when generating a sound.

The memories may store instructions for an application, e.g., from which the distributed mode loudspeaker receives the input identifying the sound to output. The one or more processors, e.g., one or more application processors, may use the instructions stored on the one or more memories to execute the application. During execution of the application, e.g., a phone application or a music application or a game, the application may determine a sound to output to a user. The application provides, to the distributed mode loudspeaker, data for the sound.

The controller or the drive module in the distributed mode loudspeaker receive the data for the sound as input. The controller may be the same component in the smartphone. In some examples, the controller is a different component in the smartphone from the drive module. The controller, the drive module, or a combination of the two, use the data for the sound to determine the subset of frequencies, select the one or more electrode pairs, and provide current to the selected one or more electrode pairs.

In some examples, the one or more processors, the one or more memories, or both, are separate from the drive module, the controller, or both. For example, the controller, the drive module, or both, may include at least one processor, at least one memory, or both. The at least one processor may be a different set of processors from the one or more processors. The at least one memory may be a different memory from the one or more memories.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory program carrier for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" refers to data processing hardware and encompasses all kinds of apparatus, devices, and machines for processing data, including by way of example a programmable processor, or multiple processors. The apparatus can also be or further include special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, an operating system, or a combination of one or more of them.

For example, a distributed mode loudspeaker, e.g., a drive module or a controller or both, may include a data processing apparatus. The distributed mode loudspeaker may use the data processing apparatus, in conjunction with at least one memory, to perform one or more of the operations described in this document.

A computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application-specific integrated circuit).

Computers suitable for the execution of a computer program include, by way of example, general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

A distributed mode loudspeaker may include one or more memories that store instructions which, when executed by the distributed mode loudspeaker, cause the distributed mode loudspeaker to perform one or more operations described in this document. For instance, the instructions may cause the distributed mode loudspeaker to determine an output frequency subset, energize one or more electrodes, or both. In some examples, the drive module or the controller or both may include the one or more memories or some of the one or more memories.

To provide for interaction with a user, embodiments of the subject matter described in this specification can be implemented on a computer having a display device, e.g., an LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method comprising:
    determining, for a piezoelectric cantilever-type transducer of a distributed mode loudspeaker adapted to cause vibration of a load within a range of frequencies, a subset of frequencies from the range of frequencies at which to output vibrations, wherein the transducer comprises a first plurality of electrodes on a first side of a piezoelectric layer and a second plurality of electrodes on a second side of the piezoelectric layer opposite the first side, the first and second pluralities of electrodes being arranged to form two or more electrode pairs positioned along a length of the transducer and each electrode pair comprising a first electrode of the first plurality of electrodes and a second electrode of the second plurality of electrodes;
    selecting, for the subset of frequencies, a respective input voltage for each of the two or more electrode pairs based on a relative position of each pair on the transducer, wherein respective input voltages for at least two of the two or more electrode pairs are different; and
    applying the respective input voltage to each of the two or more electrode pairs to cause the transducer to generate a vibrational force on the load within the range of output frequencies,
    wherein, in order to generate the vibrational force on the load within the range of output frequencies, the transducer undergoes vibrations which displace the piezoelectric layer by varying amounts along the length of the transducer, and the respective input voltages are selected to reduce an activation of a piezoelectric response at a location on the transducer corresponding to an electrode pair where the activation is out of phase with a displacement of the piezoelectric layer.

2. The method of claim 1, wherein each input voltage comprises a corresponding amplitude and a corresponding phase.

3. The method of claim 1, wherein the subset of frequencies comprises 0 kHz to 10 kHz.

4. The method of claim 1, wherein the subset of frequencies comprises 4 kHz to 10 kHz.

5. The method of claim 1, wherein the respective input voltages are selected to reduce a current drawn by the transducer for the vibrational force.

6. The method of claim 1, wherein the transducer has a total of 2 electrode pairs.

7. The method of claim 1, wherein the transducer has a total of 3 electrode pairs.

8. A system comprising:
    a piezoelectric cantilever-type transducer of a distributed mode loudspeaker adapted to cause vibration of a load within a range of frequencies, the transducer comprising a first plurality of electrodes on a first side of the piezoelectric layer and a second plurality of electrodes on a second side of the piezoelectric layer opposite the first side, the first and second pluralities of electrodes being arranged to form two or more electrode pairs positioned along a length of the transducer, each electrode pair comprising a first electrode of the first plurality of electrodes and a second electrode of the second plurality of electrodes;
    a controller adapted to determine a subset of frequencies from the range of frequencies at which to output vibrations, and select, for the subset of frequencies, a respective input voltage for each of the two or more electrode pairs based on a relative position of each pair on the transducer, wherein respective input voltages for at least two of the two or more electrode pairs are different; and
    a drive module in electrical communication with each of the two or more electrode pairs, the drive module being adapted to apply the respective input voltage to each of the two or more electrode pairs to cause the transducer to generate a vibrational force on the load within the range of output frequencies,
    wherein, in order to generate the vibrational force on the load within the range of output frequencies, the transducer is configured to undergo vibrations which displace the piezoelectric layer by varying amounts along the length of the transducer, and
    wherein the controller is adapted to select the respective input voltages so as to reduce an activation of a piezoelectric response at a location on the transducer corresponding to an electrode pair where the activation is out of phase with a displacement of the piezoelectric layer.

9. The system of claim 8, wherein each input voltage comprises a corresponding amplitude and a corresponding phase.

10. The system of claim 9, wherein the piezoelectric layer comprises a ceramic material.

11. The system of claim 8, wherein the subset of frequencies comprises 0 kHz to 10 kHz.

12. The system of claim 8, wherein the subset of frequencies comprises 4 kHz to 10 kHz.

13. The system of claim 8, wherein the controller is adapted to select respective input voltages to reduce a current drawn by the transducer for the vibrational force.

14. The system of claim 8, wherein the transducer has a total of 2 electrode pairs.

15. The system of claim 8, wherein the transducer has a total of 3 electrode pairs.

\* \* \* \* \*